United States Patent
Herr et al.

(10) Patent No.: US 9,787,312 B2
(45) Date of Patent: Oct. 10, 2017

(54) SYSTEMS AND METHODS FOR APPLYING FLUX TO A QUANTUM-COHERENT SUPERCONDUCTING CIRCUIT

(75) Inventors: Quentin P. Herr, Ellicott City, MD (US); Ofer Naaman, Ellicott City, MD (US); Anna Y. Herr, Ellicott City, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 978 days.

(21) Appl. No.: 13/585,467

(22) Filed: Aug. 14, 2012

(65) Prior Publication Data

US 2015/0263736 A1    Sep. 17, 2015

(51) Int. Cl.
| | |
|---|---|
| *H03K 19/195* | (2006.01) |
| *H03K 3/38* | (2006.01) |
| *H03K 19/166* | (2006.01) |
| *G06N 99/00* | (2010.01) |

(52) U.S. Cl.
CPC ....... *H03K 19/1954* (2013.01); *G06N 99/002* (2013.01); *H03K 3/38* (2013.01); *H03K 19/166* (2013.01)

(58) Field of Classification Search
CPC ...... B82Y 10/00; G06N 99/002; H03K 17/92; H03K 19/1952; H03K 19/1954
USPC .......... 326/1–7; 327/367, 527, 528
See application file for complete search history.

(56) References Cited

U.S. PATENT DOCUMENTS

| | | | |
|---|---|---|---|
| 4,325,257 A * | 4/1982 | Kino ................. | G01N 29/262 367/123 |
| 5,936,458 A * | 8/1999 | Rylov ............... | H03K 3/38 327/528 |
| 7,498,832 B2 | 3/2009 | Baumgardner et al. | |
| 7,714,605 B2 | 5/2010 | Baumgardner et al. | |
| 7,724,020 B2 * | 5/2010 | Herr ................... | B82Y 10/00 326/3 |
| 7,772,871 B2 | 8/2010 | Herr et al. | |
| 7,772,872 B2 | 8/2010 | Lewis | |
| 7,782,077 B2 | 8/2010 | Herr et al. | |
| 8,111,083 B1 | 2/2012 | Pesetski et al. | |

(Continued)

FOREIGN PATENT DOCUMENTS

WO    WO 98/08304 A1    2/1998

OTHER PUBLICATIONS

Polonsky, et. al., "Transmission of Single-Flux-Quantum Pulses along Superconducting Microstrip Lines," IEEE Trans. on Applied Superconductivity, vol. 3, No. 1, Mar. 1993, pp. 259-2600.*

(Continued)

*Primary Examiner* — Alexander H Taningco
*Assistant Examiner* — Seokjin Kim
(74) *Attorney, Agent, or Firm* — Tarolli, Sundheim, Covell & Tummino LLP

(57) ABSTRACT

Systems and methods are provided for applying flux to a quantum-coherent superconducting circuit. In one example, a system includes a long-Josephson junction (LJJ), an inductive loop coupled to the LJJ and inductively coupled to the quantum-coherent superconducting circuit, and a single flux quantum (SFQ) controller configured to apply a SFQ pulse to a first end of the LJJ that propagates the SFQ pulse to a second end of the LJJ, while also applying a flux quantum to the inductive loop resulting in a first value of control flux being applied to the quantum-coherent superconducting circuit.

18 Claims, 6 Drawing Sheets

(56) References Cited

U.S. PATENT DOCUMENTS

| | | | |
|---|---|---|---|
| 2005/0231196 A1 | 10/2005 | Tarutani et al. | |
| 2009/0014714 A1* | 1/2009 | Koch | B82Y 10/00 257/31 |
| 2009/0082209 A1* | 3/2009 | Bunyk | B82Y 10/00 505/190 |
| 2009/0322374 A1 | 12/2009 | Przybysz et al. | |
| 2012/0094838 A1 | 4/2012 | Bunyk et al. | |
| 2013/0015885 A1* | 1/2013 | Naaman | H03K 3/38 327/1 |

OTHER PUBLICATIONS

Ohki, et. al., "Low-Jc Rapid Single Flux Quantum (RSFQ) Qubit Control Circuit", IEEE Transactions on Applied Superconductivity, vol. 17, No. 2, Jun. 2007.*

Semenov, et. al, "SFQ Control Circuits for Josephson Junction Qubits", IEEE Trans. on Applied Superconductivity, vol. 13, No. 2, Jun. 2003, pp. 960-965.*

Ohki (Ohki, et. al., "Low-Jc Rapid Single Flux Quantum (RSFQ) Qubit Control Circuit", IEEE Transactions on Applied Superconductivity, vol. 17, No. 2, Jun. 2007).*

Polonsky (Polonsky, et. al., "Transmission of Single-Flux-Quantum Pulses along Superconducting Microstrip Lines," IEEE Trans. on Applied Superconductivity, vol. 3, No. 1, Mar. 1993, pp. 2598-2600).*

Polonsky, et. al., "Transmission of Single-Flux-Quantum Pulses along Superconducting Microstrip Lines," IEEE Trans. On Applied Superconductivity, vol. 3, No. 1, Mar. 1993, pp. 2598-2600.*

Allman, et al.: "*rf-SQUID-Mediated Coherent Tunable Coupling Between a Superconducting Phase Qubit and a Lumped-Element Resonator*"; Physical Review Letters, 2010 The American Physical Society, PRL 104, week ending Apr. 30, 2010, pp. 177004-1 thru 177004-4.

Johnson, et al.: "*A Scalable Control System for a Superconducting Adiabatic Quantum Optimization Processor*"; arXiv:0907.3757v2 [quant-ph] Mar. 24, 2010, pp. 1-14.

Ohki, et al.: "*Low-Jc Rapid Single Flux Quantum (RSFQ) Qubit Control Circuit*"; IEEE Transactions on Applied Superconductivity, vol. 17, No. 2, Jun. 2007, pp. 154-157.

EU FP6-502807 RSFQubit , RSFQ Control of Josephson Junctions Qubits, D7: Report on the Evaluation of the RSFQ Circuitry for Qubit Control, Sep. 1, 2005, pp. 1-16.

Semenov et al. "*SFQ Control Circuits for Josephson Junction Qubits*"; IEEE Transactions on Applied Superconductivity, vol. 13, No. 2, Jun. 2003, p. 960-965.

International Search Report for corresponding PCT/US2013/054161, dated Feb. 25, 2014.

* cited by examiner

SYSTEMS AND METHODS FOR APPLYING FLUX TO A QUANTUM-COHERENT SUPERCONDUCTING CIRCUIT

The invention was made under a contract with an agency of the United States Government, contract number W911NF-11-C-0069.

TECHNICAL FIELD

The present invention relates generally to superconducting circuits, and more particularly to systems and methods for applying flux to a quantum-coherent superconducting circuit.

BACKGROUND

In a quantum computer, a quantum algorithm is carried out by applying a series of pulses to a multitude of qubits and coupling elements, such that each pulse sequence realizes a quantum gate. In many superconducting implementations (such as the phase, flux, and transmon qubit based architectures), these control pulses take the form of magnetic flux applied to the qubits. These control pulses are typically generated by room-temperature electronics and are introduced into the cryogenic package via coaxial lines. However, the coaxial line solution is not scalable to the degree required in a useful quantum processor. To achieve the desired level of integration it is necessary to integrate the control circuitry in the qubit cryopackage, and preferably on the same chip as the qubits. Superconducting single-flux-quantum (SFQ) digital technology is a natural choice for implementing integrated control circuitry.

However, there are several difficulties in interfacing SFQ digital control to a quantum-coherent superconducting circuit. First, the shunt resistors that are typically employed in SFQ logic can provide a dissipative environment to the qubits. Second, SFQ pulses generally have a very fast rise-time on the order of few picoseconds and applying them directly to a qubit having an operating frequency of a few GHz will cause significant loss of fidelity by inducing unwanted transitions in the qubit. As an example, for a qubit operating at 10 GHz, the rise-time of the SFQ pulses must be increased to an order of a nanosecond to keep the control adiabatic. Adiabatic control of a qubit with SFQ pulses therefore requires either heavily damping the junctions that generate the control pulses or heavy low-pass filtering of the SFQ pulses. Those skilled in the art of filter design will recognize that any low-pass filter must be at least singly terminated, and therefore filtering the SFQ pulses involves significant damping as well. Since any coupling of the qubit to dissipation sources significantly degrade its coherence, the coupling between the qubit and the control circuitry must be extremely small, and therefore efficiently applying control flux from an SFQ source to a coherent qubit circuit remains a challenge.

SUMMARY

In accordance with an embodiment of the present invention, a system is provided for applying flux to a quantum-coherent superconducting circuit. The system comprises a long Josephson junction (LJJ), an inductive loop connected to the LJJ and inductively coupled to the quantum-coherent superconducting circuit, and a single flux quantum (SFQ) controller configured to apply a SFQ pulse to a first end of the LJJ, which propagates the SFQ pulse to a second end of the LJJ, while also applying a flux quantum to the inductive loop resulting in a first value of control flux being applied to the quantum-coherent superconducting circuit.

In accordance with yet another embodiment, a system is provided for applying flux to a quantum-coherent superconducting circuit. The system comprises a LJJ, an inductive loop connected to the LJJ at a midpoint of the LJJ and inductively coupled to the quantum-coherent superconducting circuit, and a DC source inductively coupled to the inductive coupling loop to provide a half of a flux quantum flux bias to the loop to establish a bi-stable persistent current in the inductive loop that is initially in a first direction of circulation resulting in a first value of control flux applied to the quantum-coherent superconducting circuit. The system further comprises a SFQ controller configured to apply a positive SFQ pulse to a first end of the LJJ, which propagates the positive SFQ pulse to a matched load at a second end of the LJJ, while also applying a flux quantum to the inductive loop resulting in the bi-stable persistent current of the inductive loop switching from a first direction of circulation to a second direction of circulation resulting in a second value of control flux being applied to the quantum-coherent superconducting circuit.

In accordance with another embodiment, a method is provided for applying flux to a quantum-coherent superconducting circuit. The method comprises providing an inductive loop connected to a LJJ at a midpoint of the LJJ and inductively coupled to the quantum-coherent superconducting circuit. The method further comprises applying a DC flux bias to the inductive loop to establish a half of flux quantum flux bias that establishes a bi-stable persistent current in the inductive loop that is initially in a first direction resulting in a first value of control flux applied to the quantum coherent circuit, applying a positive single SFQ pulse to a first end of the LJJ array, which propagates the positive SFQ pulse to a matched load at a second end of the LJJ array, while also applying a flux quantum to the inductive loop resulting in a second value of control flux applied to the of the quantum-coherent superconducting circuit. The method can further comprise applying a negative SFQ pulse to a first end of the LJJ array, which propagates the negative SFQ pulse to a matched load at a second end of the LJJ array, while also resetting the flux enclosed by the inductive loop to its initial value resulting in the control flux applied to the quantum-coherent circuit resetting to its initial value.

DETAILED DESCRIPTION

Figure 1:
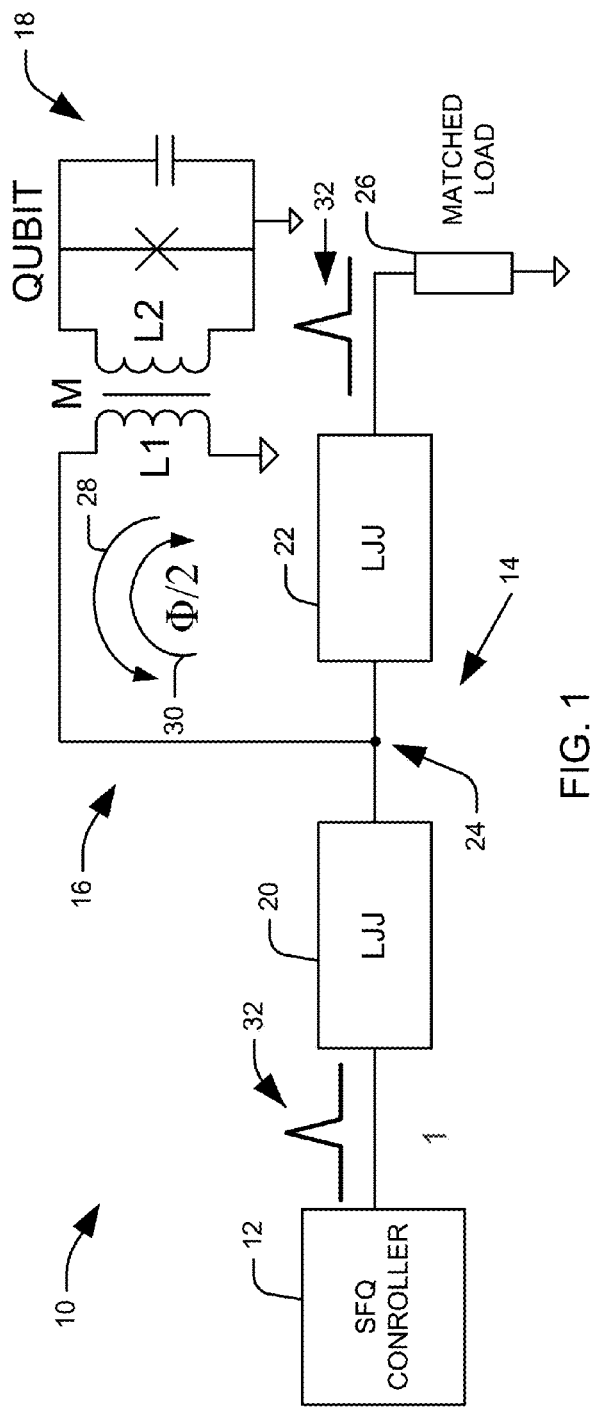
FIG. 1 illustrates a functional block diagram of an embodiment of a system for applying flux to a quantum-coherent superconducting circuit.

FIG. 1 illustrates a functional block diagram of an embodiment of a system 10 for applying flux to a quantum-coherent superconducting circuit 18. The system 10 is configured to enable coupling of the quantum coherent superconducting circuit 18 to an SFQ controller 12 with relatively large coupling efficiency, slow pulse rise-times, and without degrading the quantum circuit's coherence. In the example of FIG. 1, the quantum coherent superconducting circuit 18 is a qubit. However, the system 10 can apply flux to a variety of other quantum coherent superconducting circuits without degrading the quantum circuit's coherence.

The system 10 utilizes a Long Josephson junction (LJJ) 14. The LJJ can be a single wide Josephson junction (e.g., 2 um wide by 200-500 um long) arrangement coupled between an input inductance and an output inductance, and having a distributed capacitance in parallel with the junction that is characteristic of the junction technology. Alternatively, the LJJ can be implemented as a Josephson junction array in a long-Josephson-junction limit arrangement, which is a parallel array of un-shunted Josephson junctions (i.e., no shunt resistor in parallel with the Josephson junctions). The Josephson junction array in the long junction limit arrangement can include Josephson junctions (e.g., about 3 µm×about 3 µm) with series inductors (e.g., about 30 µm long) for a LJJ arrangement that can range from about 600 µm to about 1000 µm in length. The parallel array of un-shunted Josephson junctions are tightly coupled via small inductors, forming a passive Josephson transmission line (JTL) in the long-Josephson-junction limit (LJJ arrangement 14). The LJJ 14 is coupled in parallel with an inductive loop 16 to cooperate to couple the SFQ controller 12 to the qubit 18. The LJJ 14 provides the necessary electrical isolation of the qubit 18 from dissipation sources in the SFQ controller 12 and a matched load 26 over a wide band from DC to several times the qubit frequency.

Figure 2:
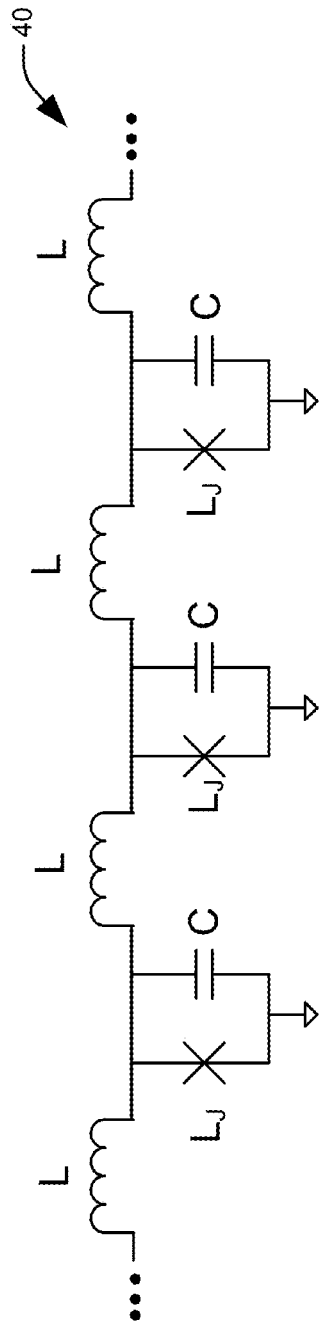
FIG. 2 illustrates an example schematic diagram of a portion of a Josephson transmission line (JTL) in a long-Josephson-junction limit arrangement.

An example of such a LJJ arrangement 40 is illustrated in the Josephson junction transmission line (JTL) circuit schematic shown FIG. 2. The LJJ arrangement 40 includes a parallel array of un-shunted Josephson junctions (having inductance $L_J$), connected in parallel with capacitors C that form a long JTL or LJJ arrangement. The repeating cells in the array are interconnected by series inductors L. The LJJ arrangement 40 allows propagation of SFQ pulses as fluxons—soliton solutions of the sine-Gordon equation describing a LJJ. The LJJ behaves as a multi-section high-pass filter for small-oscillation modes with a cutoff frequency that can be set several times higher than the frequency range of the qubit, effectively isolating the qubit from dissipative elements associated with the SFQ controller 12.

"Long junction limit" refers to the case where in a JTL the inductance of the Josephson junction ($L_J = \hbar/2eI_0$, where $I_0$ is the junction critical current) is larger than the series inductance L. "LJJ" as illustrated in FIG. 1 is composed of several stages of JTL in a long junction limit array arrangement connected in parallel (e.g., FIG. 2 shows 3 such stages). The SFQ in a LJJ is spread over several stages, typically this number is the square root of L_J/L, and the LJJ will have to have at least that many stages of JTL. In the circuit described FIG. 4, the sqrt(L_J/L) is approximately 4 whereas the length of the LJJ is total of 26 JTL stages.

Referring again to FIG. 1, interface to the qubit 18 is established by connecting the inductive loop 16 having inductance $L_b$ in parallel with the LJJ 14, at a midpoint 24 of a first LJJ portion 20 of the LJJ 14 and a second LJJ portion 22 of the LJJ 14. A DC flux bias (illustrated in FIG. 3) of half a flux quantum is externally applied to the inductive loop 16 having an inductor L1 mutually coupled to an inductor L2 of the qubit. The DC flux bias establishes a bi-stable persistent current in the inductive loop 16 that is initially a circulating current 28 that screens the externally applied flux so that the total flux enclosed by the inductive loop 16 is zero. Circulating current 28 induces a magnetic flux in the qubit due to the mutual inductance M providing the qubit with a first value of control flux to set the qubit, for example, at a first resonance frequency.

A positive fluxon 32 traveling along the LJJ 14 will pass the inductive loop 16 and change the total flux enclosed by the inductive loop 16 by a whole flux quantum, thus reversing the direction of circulation of the persistent current 30 in the inductive loop 16 and affecting a change in magnetic flux coupled to the qubit 18 via mutual inductance M. This provides the qubit with a second value of control flux, to set the qubit for example at a second resonance frequency. The positive fluxon 32 terminates in the matched load impedance 26 to mitigate any possible reflections. Alternatively, a negative fluxon can be transmitted from the second end to the first end of the LJJ 14 and have the same effect as the positive fluxon 32 traveling from the first end to the second end of the LJJ 14.

Figure 3:
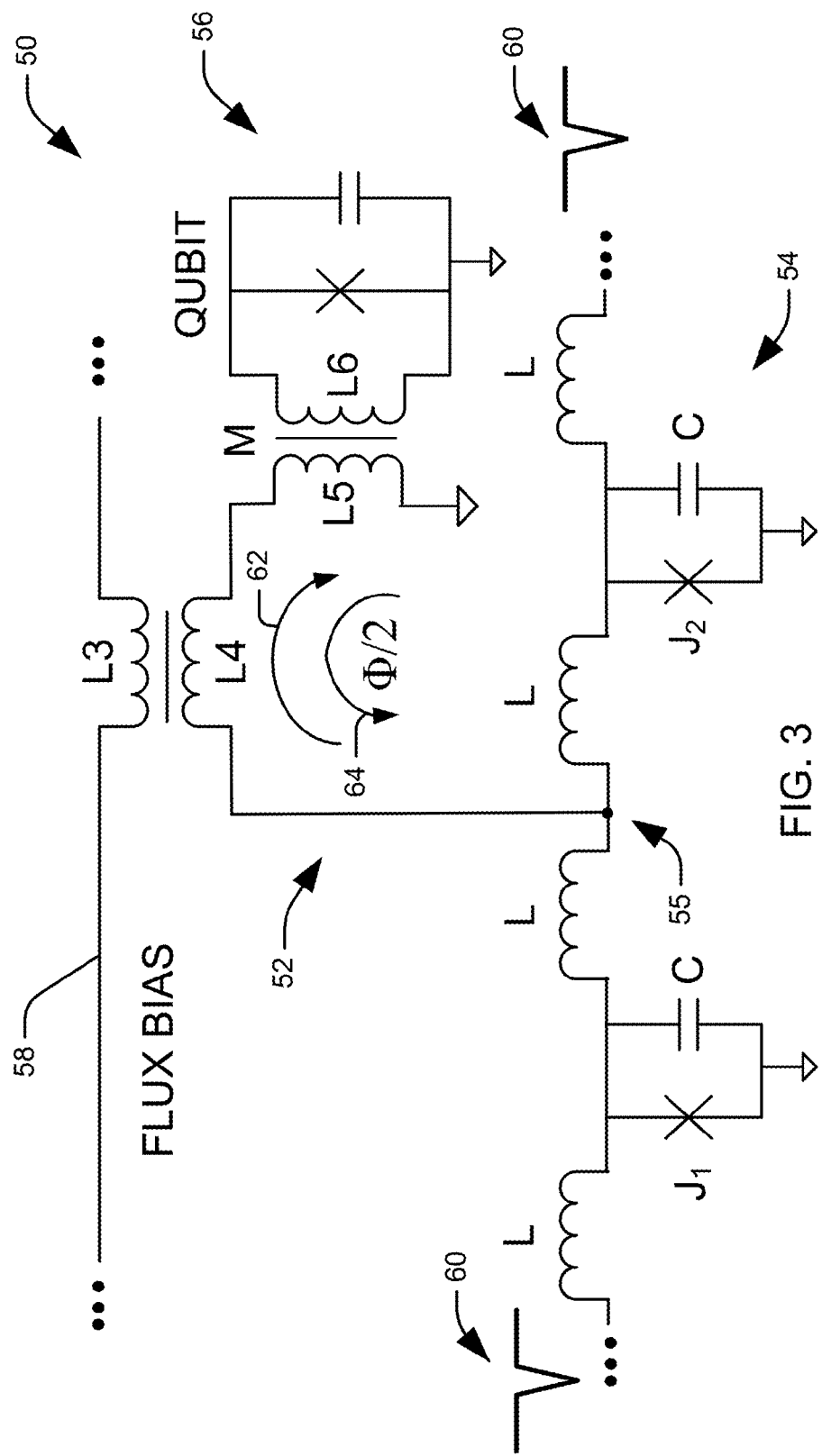
FIG. 3 illustrates a circuit schematic of a portion of an embodiment of the system for applying flux to a quantum-coherent superconducting circuit.

FIG. 3 illustrates a circuit schematic of a portion of an embodiment of the system 50 for applying flux to a quantum-coherent superconducting circuit. FIG. 3 illustrates in detail an inductive loop 52 between a qubit 56 and a portion of an LJJ 54. The qubit is coupled via a mutual inductance M to the inductive loop 52 having an inductance $L_b$, with $L_b \gg L$ of the LJJ 54, connected in parallel at a midpoint 55 of the LJJ array. The inductive loop 52 having inductance $L_b$ and the parallel combination of Josephson junctions $J_1$ and $J_2$ from the LJJ 54 form a device known as an RF-SQUID, which is threaded by a DC flux bias of half a flux quantum, $\Phi_0/2$ from a DC flux bias line 58 via inductors L3 and L4. Thus biased, the RF-SQUID is bi-stable and the total flux in the loop is either zero (persistent currents in the loop screen the externally applied flux bias), or one flux quantum (persistent currents in the loop add to the externally applied flux bias). The RF-SQUID can be switched from one state (zero flux) to the other (one flux quantum) by advancing the phase of junctions $J_1$ and $J_2$ by $2\pi$, which is accomplished by moving a single fluxon from left to right through the LJJ 54 in FIG. 3 through both junctions $J_1$ and $J_2$.

The total flux enclosed by the inductive loop 52 may be reset to zero by moving a single fluxon from right to left through the LLJ 54, or alternatively by moving an anti-fluxon from left to right through the LLJ array 54. In the example illustrated in FIG. 3, the bistable persistent current is initially a clockwise current 62 and an anti-fluxon 60 moving from left to right through the LJJ array 54 reverses the persistent current in the clockwise direction to a counterclockwise current 64. The bistable persistent current $I_p$ in the coupling loop 52 in turn induces flux inside the qubit 56, with magnitude $\pm MI_p$. Therefore, the flux swing applied to the qubit is $\Phi_q = 2MI_p$, with a rise-time that is determined by the velocity of the fluxon propagating on the LJJ array 54, and has the universal pulse shape of a sine-Gordon soliton.

Ideally, the propagation velocity of the fluxon can be made arbitrarily small, suggesting that the rise-time of the flux pulse at the qubit can be made arbitrarily long. However slow fluxons are susceptible to scattering and trapping by inhomogeneities in the LJJ array 54, which puts practical limits on the possible range of fluxon velocities that may be used. Rise-times of the order of 1 ns are within range of what can be considered as practical with current technology.

Figure 4:
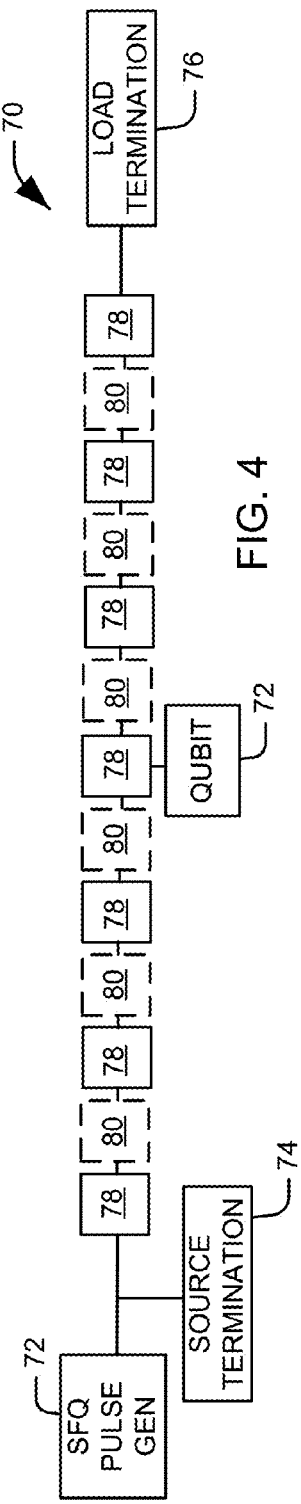
FIG. 4 shows an example system for applying flux to a quantum-coherent superconducting circuit that has been simulated and optimized.

FIG. 4 shows an example system 70 for applying flux to a quantum-coherent superconducting circuit that has been simulated and optimized. Component values are given for a particular fabrication process, and it is understood that component values may be different in any given implementation based on application and process requirements. A qubit 72 is coupled at the center point of a 26 junction array 70, each cell of the array 70 is depicted as a square in the figure having two Josephson junctions with critical current of 10 µA (the first and last cells may have higher critical currents to compensate for boundary effects), and with each junction shunted by a 0.5 pF capacitor. The purpose of the capacitors connected to each of the junctions is twofold: 1) to reduce the propagation velocity of the fluxons, and 2) to increase the effective mass of the fluxons making them less susceptible to thermal noise. Each of the cells additionally contains two inductors L=1.83 pH connecting one junction to the next as illustrated in FIG. 2.

To increase the uniformity of the LJJ and avoid scattering of the fluxons off of the cell that is connected to the qubit, every other cell 78 in the array 70 (solid squares in FIG. 4) has an inductor $L_b$=350 pH attached to it in parallel and enclosing an external flux of $\Phi_0/2$ (but is not connected to a qubit). The other cells 80 in the array 70 (dashed squares) are not flux-biased and do not have an extra inductor connected to them. The array 70 is additionally terminated with a matched load termination 76 and a source termination 74 between a SFQ pulse generator 72 and the array 70. We note that the source termination 74 may instead be included as a part of the SFQ generator 72. It is to be further appreciated that the load termination can instead be a part of additional circuitry, e.g. a receiver, that may monitor the status of the LJJ or use the emerging fluxon for further digital processing. The values of the source and load terminations are determined by the fluxon velocity, roughly through R=Lv, where v is the velocity and L is the series inductance in the array per unit length. The LJJ is fed with heavily damped SFQ pulses from the SFQ controller 72 of 0.5 ns width and either positive or negative polarity.

Figure 5:
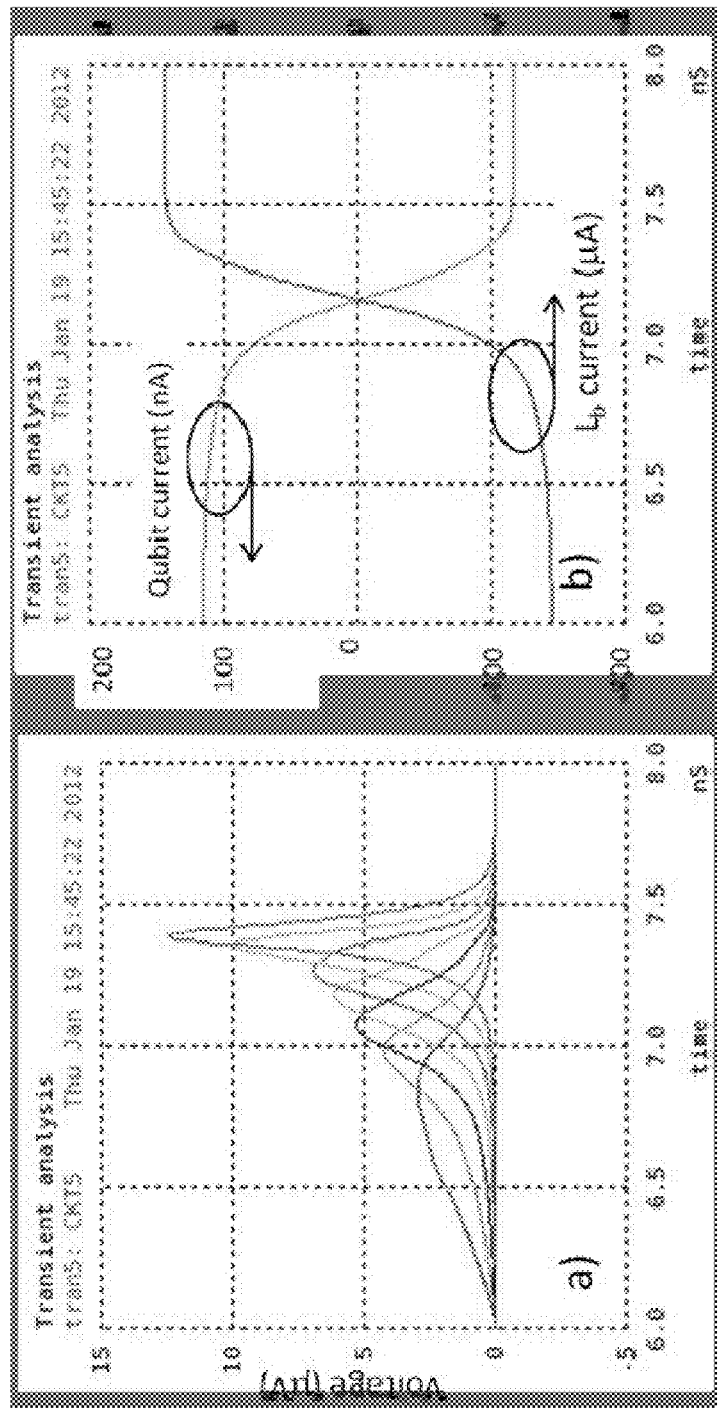
FIG. 5 shows the results of a SPICE simulation of the circuit described in FIG. 4.

FIG. 5 shows the results of a SPICE simulation of the circuit described in FIG. 4. Panel (a) shows the soliton waveform as it travels through the array. Panel (b) demonstrates the operation of the device in applying a well-controlled flux signal to the qubit, with rise-time of 0.5 ns. In another simulation, the effects of the source and load terminating resistors on the quality factor of the qubit were investigated. For a given mutual inductance M of the qubit to the coupling loop, the real part of the effective admittance seen by the qubit is calculated, and from this the qubit relaxation time $T_1$ and dephasing time $T_\phi$ are calculated. Simulations show that with M=45 pH (a coupling efficiency approaching 10%) the relaxation and dephasing times exceed 10 µs and 500 µs, respectively, demonstrating efficient broadband isolation from the terminating resistors.

It is possible to get more isolation by increasing the number of junctions in the LJJ. However, parasitic capacitive coupling from the qubit to the LJJ may limit the isolation in practice. In the example, of FIG. 4, 13 junctions on either side of the qubit-coupled cell provide sufficient isolation with diminishing returns on increasing the junction count. Furthermore, the design shown in FIG. 4 has been determined to be robust to global variations in the fabrication process critical current density, and has ±20% operating margins against non-uniformity of the junction critical current across the device.

Figure 6:
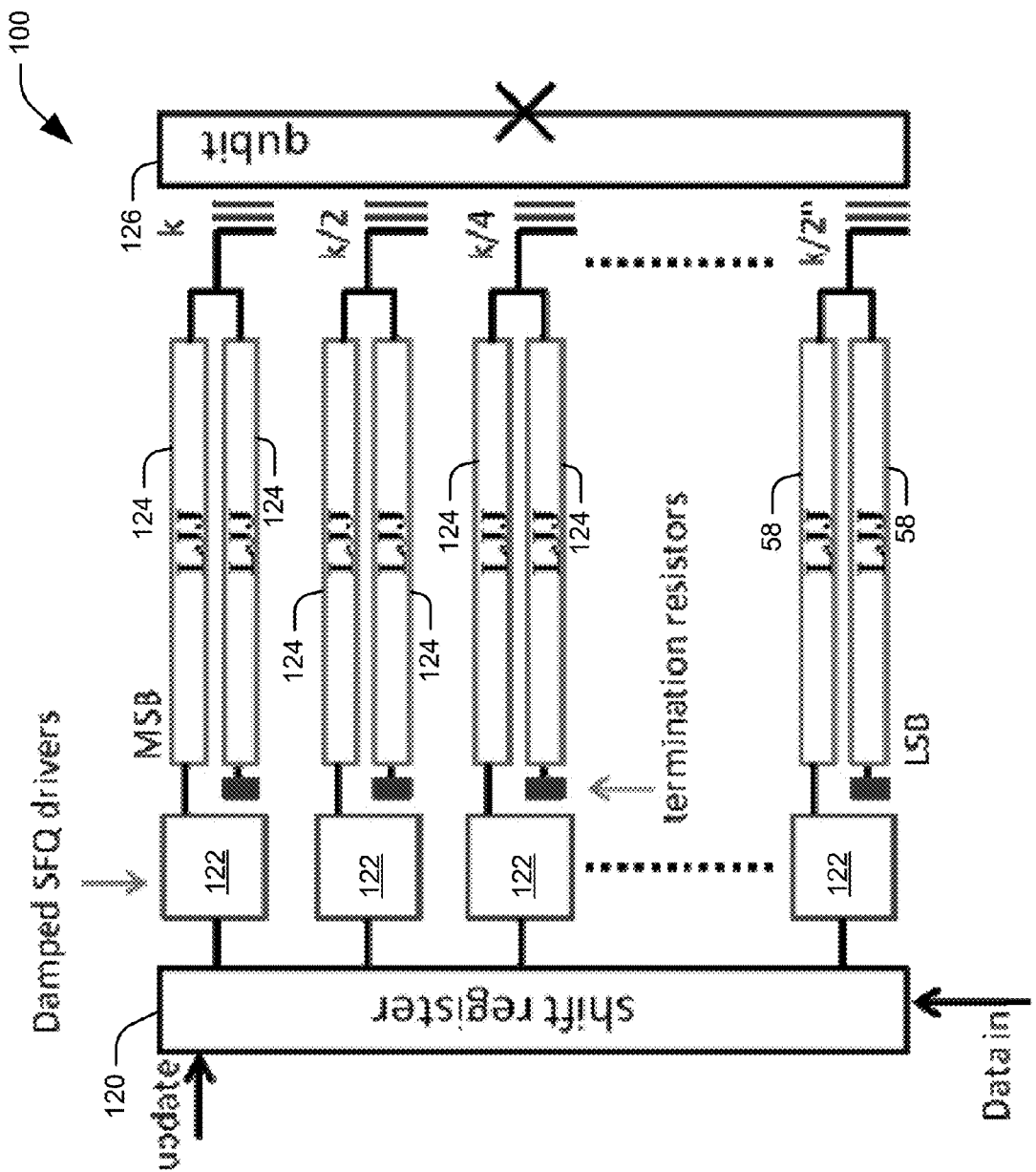
FIG. 6 illustrates an example embodiment of an application of the invention in an N-bit DAC.

FIG. 6 illustrates an example embodiment of an application of the invention in an N-bit DAC 100 controlling a qubit 126. Each bit of the DAC 100 is coupled to the qubit 126 via an LJJ 124, with the coupling efficiency of each LJJ 124 varying from a maximum value of k at the most-significant-bit, to a value of $k/2^n$ for the least-significant-bit where n is the number of bits. A DAC shift register 120 can be fed serially at low speed via the 'Data in' port, and the data applied to the qubit in parallel at high speed where each update of the DAC code is triggered by an SFQ pulse at the 'update' port. Update pulses may be generated, for example, in response to a program counter time-out condition, or in response to an interrupt issued conditionally based on a measurement result of a different qubit in a quantum processor. The DAC shift register 120 may be of a destructive-readout type, or a non-destructive readout type, or can be implemented as addressable program memory registers. It should be appreciated that the LJJs may directly connect each DAC bit to the qubit 126 as shown in FIG. 6, or via any combination of direct mutual coupling and coupling through one or more flux transformers.

Figure 7:
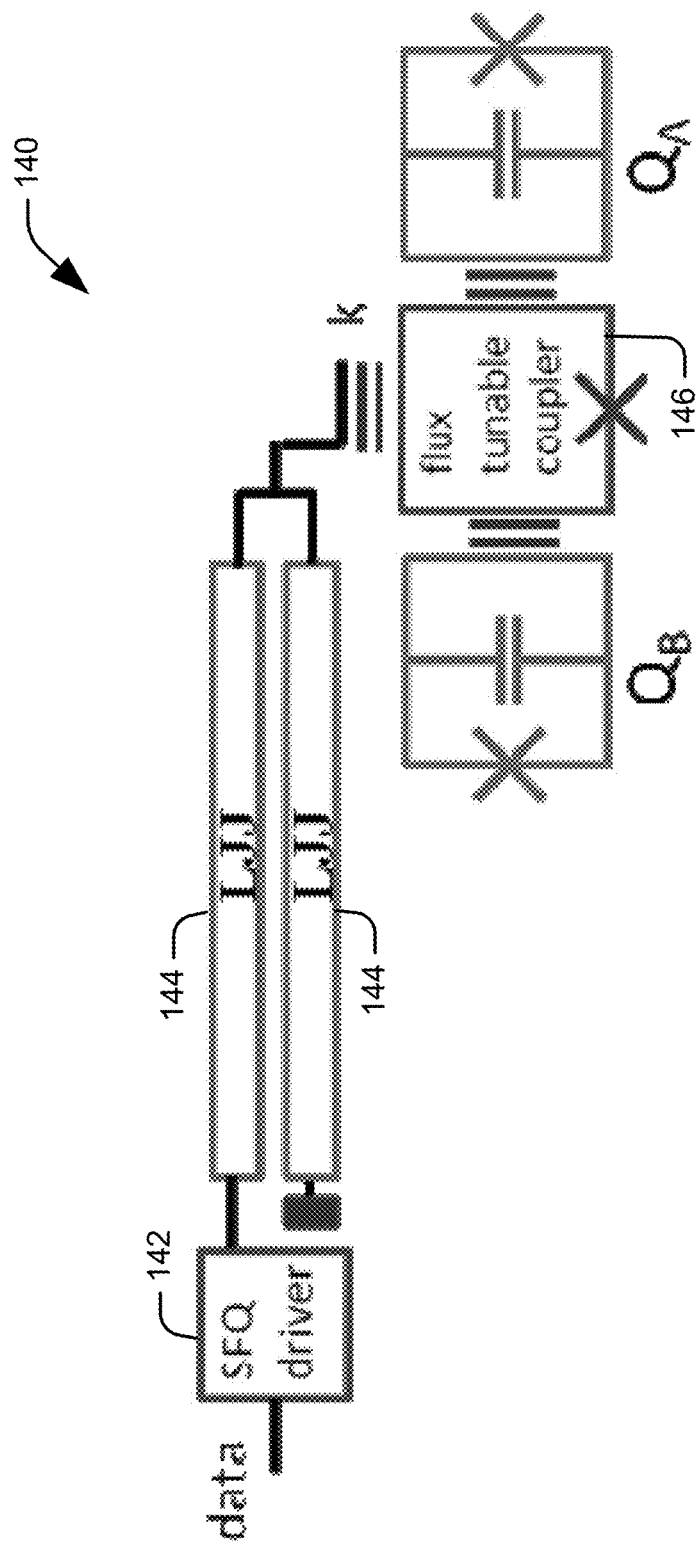
FIG. 7 illustrates an example application of the present invention to actuate a flux-tunable coupler.

FIG. 7 illustrates an example application of the present invention to actuate a flux-tunable coupler 146. Qubits $Q_A$ and $Q_B$ are both coupled to an RF-SQUID, so that the effective mutual inductance between the two qubits is a function of the flux applied to the RF-SQUID. Data is provided by an SFQ driver 144 through LJJs 144 to the flux tunable coupler 146. In this application, isolation of the circuit from dissipation is as important as in direct qubit control, but the requirements on the rise-time of the control pulse may be less stringent.

Figure 8:
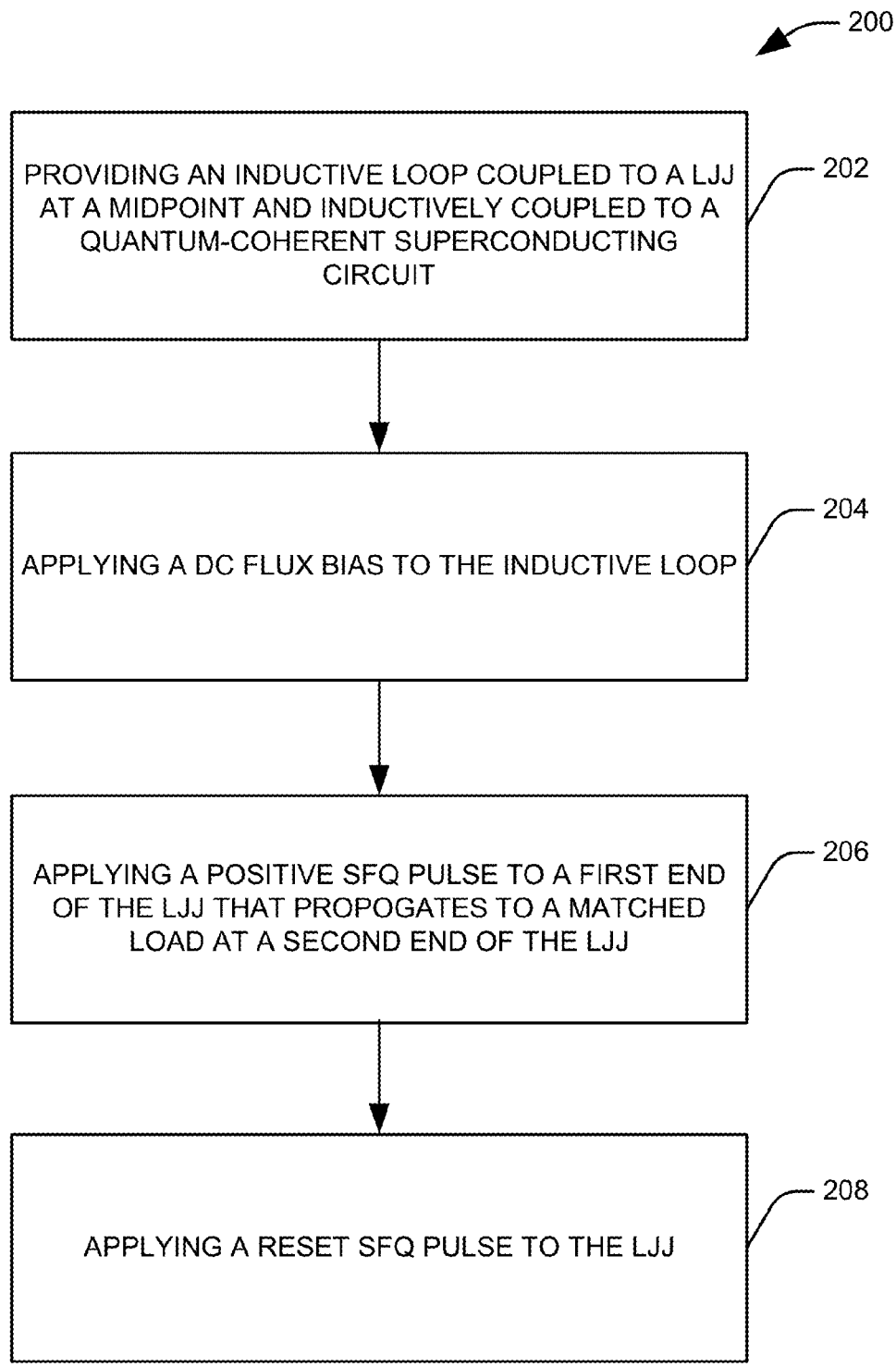
FIG. 8 illustrates a flow diagram of a method for applying flux to a quantum-coherent superconducting circuit.

In view of the foregoing structural and functional features described above, an example methodology will be better appreciated with reference to FIG. 8. While, for purposes of simplicity of explanation, the methodology of FIG. 8 is shown and described as executing serially, it is to be understood and appreciated that the present invention is not limited by the illustrated order, as some actions could in other examples occur in different orders and/or concurrently from that shown and described herein.

FIG. 8 illustrates a flow diagram of a method for applying flux to a quantum-coherent superconducting circuit. The method begins at 202, where an inductive loop is provided that is coupled to a long-Josephson junction (LJJ) or a Josephson junction array in the long-Josephson-junction limit arrangement at a midpoint and inductively coupled to the quantum-coherent superconducting circuit. The methodology then proceeds to 204, where a DC flux bias is applied to the inductive loop to establish a half of flux quantum that establishes a bi-stable persistent current in the inductive loop that is initially in a first direction (e.g., counterclockwise direction), thus resulting in a first value of control flux applied to the quantum-coherent circuit. At 206, a positive single flux quantum (SFQ) pulse is applied to a first end of the LJJ that propagates the positive SFQ pulse to a matched load at a second end of the LJJ, while also applying a flux quantum to the inductive loop resulting in a second value of control flux applied to the quantum-coherent superconducting circuit. The second value of control flux applied to the quantum-coherent superconducting circuit is due to a reversal in the direction of circulation of the bi-stable persistent current in the inductive loop (e.g., to a clockwise direction) induced by the passage of the positive SFQ. The methodology then proceeds to 208.

At 208, a reset SFQ pulse is provided to the LJJ, which removes a flux quantum from the inductive loop resulting in a reset of the control flux applied to the quantum-coherent superconducting circuit to its initial first value, due to the bi-stable persistent current in the inductive loop changing back to the first direction (e.g., counterclockwise direction). The reset SFQ pulse can be applying of a negative SFQ pulse to the first end of the LJJ array that propagates the negative SFQ pulse to the matched load at the second end of the LJJ array, or applying a positive SFQ pulse to the second end of the LJJ array that propagates to the first end of the LJJ array.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A system for applying flux to a quantum-coherent superconducting circuit, the system comprising:
    a long-Josephson junction (LJJ);
    an inductive loop coupled to a midpoint of the LJJ, in parallel with the LJJ, and inductively coupled to the quantum-coherent superconducting circuit; and
    a single flux quantum (SFQ) controller configured to apply a combination of a positive single flux quantum (SFQ) pulse and a negative SFQ pulse with respect to at least one of a first end of the LJJ and a second end of the LJJ to set a flux quantum of the inductive loop to a first value of control flux and a second value of control flux, respectively, that is applied to the quantum-coherent superconducting circuit.

2. The system of claim 1, wherein the applying the combination of the positive SFQ pulse and the negative SFQ pulse comprises:
    applying the positive SFQ pulse to the first end of the LJJ that propagates the positive SFQ pulse to a matched load at the second end of the LJJ, while also applying the flux quantum to the inductive loop to set the first value of control flux; and
    applying the negative SFQ pulse to the first end of the LJJ that propagates the negative SFQ pulse to the matched load at the second end of the LJJ, after the applying of the positive SFQ pulse to the first end, while also removing the flux quantum from the inductive loop resulting in the second value of control flux being applied to the quantum-coherent superconducting circuit.

3. The system of claim 1, wherein the applying the combination of the positive SFQ pulse and the negative SFQ pulse comprises:
    applying the negative SFQ pulse to the second end of the LJJ that propagates the negative SFQ pulse to the first end of the LJJ, while also applying the flux quantum to the inductive loop to set the first value of control flux; and
    applying the positive SFQ pulse to the second end of the LJJ that propagates the positive SFQ pulse to the first end of the LJJ, after the applying of the negative SFQ pulse to the second end, while also removing the flux quantum from the inductive loop resulting in the second value of control flux being applied to the quantum-coherent superconducting circuit.

4. The system of claim 1, wherein the inductive loop is DC flux biased to establish a half of flux quantum that establishes a bi-stable persistent current in the inductive loop that is initially in a first direction.

5. The system of claim 4, wherein applying the flux quantum to the inductive loop with the positive SFQ pulse results in the first value of control flux applied to the quantum-coherent superconducting circuit and is due to a change of the bi-stable persistent current in the inductive loop changing to a second direction in the inductive loop opposite the first direction.

6. The system of claim 1, wherein the quantum coherent superconducting circuit is a qubit.

7. An N-bit digital-to-analog converter comprising N systems of claim 1, coupled between a shift register and a qubit, wherein each of the different N systems have different coupling efficiencies to the qubit each associated with a significance of an associated bit of the N-bit digital-to-analog converter.

8. The system of claim 1, wherein the LJJ is implemented as one of a Josephson junction array in a long-Josephson-junction limit arrangement and a single wide Josephson junction arrangement.

9. A system for actuating a flux-tunable coupler comprising the system of claim 1, coupled to a flux tunable coupler that is coupled to a first qubit and a second qubit.

10. A system for applying flux to a quantum-coherent superconducting circuit, the system comprising:
    a long-Josephson junction (LJJ) implemented as a Josephson junction array in a long-Josephson-junction limit arrangement;
    an inductive loop coupled to the LJJ at a midpoint of the LJJ, in parallel with the LJJ, and inductively coupled to the quantum-coherent superconducting circuit;
    a DC source inductively coupled to the inductive loop to provide a DC flux bias to establish a half of flux quantum that establishes a bi-stable persistent current in the inductive loop that is initially in a first direction; and
    a single flux quantum (SFQ) controller configured to apply:
        a first negative single flux quantum (SFQ) pulse to a first end of the LJJ that propagates the first negative SFQ pulse to a second end of the LJJ, while also applying a flux quantum to the inductive loop resulting in a first value of control flux being applied to the quantum-coherent superconducting circuit; and
        a second negative SFQ pulse to the second end of the LJJ that propagates the second negative SFQ pulse to the first end of the LJJ, while also removing the flux quantum from the inductive loop resulting in a second value of control flux being applied to the quantum-coherent superconducting circuit.

11. The system of claim 10, wherein the applying the flux quantum to the inductive loop with the first negative SFQ pulse resulting in the first value of control flux applied to the quantum-coherent superconducting circuit is due to a change of the bi-stable persistent current in the inductive loop changing to a second direction in the inductive loop.

12. The system of claim 11, wherein the removing the flux quantum from the inductive loop resulting in the second value of control flux applied to the quantum-coherent superconducting circuit is due to a change of the bi-stable persistence current in the inductive loop changing back to the first direction.

13. A method for applying flux to a quantum-coherent superconducting circuit, the method comprising:
applying a DC flux bias to an inductive loop coupled to a long-Josephson junction (LJJ), in parallel with the LJJ, and inductively coupled to the quantum-coherent superconducting circuit to establish a half of flux quantum that establishes a bi-stable persistent current in the inductive loop that is initially in a first direction;
applying a combination of a positive single flux quantum (SFQ) pulse and a negative SFQ pulse with respect to at least one of a first end of the LJJ and a second end of the LJJ to set a flux quantum of the inductive loop to a first value of control flux and a second value of control flux, respectively, that is applied to the quantum-coherent superconducting circuit.

14. The method of claim 13, wherein the applying the combination of the positive SFQ pulse and the negative SFQ pulse comprises:
applying the positive SFQ pulse to the first end of the LJJ that propagates the positive SFQ pulse to a matched load at the second end of the LJJ, after the applying of a positive SFQ pulse to the first end, while also applying the flux quantum to the inductive loop to set the first value of control flux; and
applying the negative SFQ pulse to the first end of the LJJ that propagates the negative SFQ pulse to the matched load at the second end of the LJJ, after the applying of the positive SFQ pulse to the first end, while also removing the flux quantum from the inductive loop resulting in the second value of control flux being applied to the quantum-coherent superconducting circuit.

15. The method of claim 14, wherein applying the flux quantum to the inductive loop with the positive SFQ pulse to in the first value of control flux is due to a change of the bi-stable persistent current in the inductive loop changing to a second direction opposite the first direction.

16. The method of claim 13, wherein the LJJ is implemented as one of a Josephson junction array in a long-Josephson-junction limit arrangement and a single wide Josephson junction arrangement.

17. The method of claim 13, wherein the applying the combination of the positive SFQ pulse and the negative SFQ pulse comprises:
applying the negative SFQ pulse to the second end of the LJJ that propagates the negative SFQ pulse to the first end of the LJJ, while also applying the flux quantum to the inductive loop to set the first value of control flux; and
applying the positive SFQ pulse to the second end of the LJJ that propagates the positive SFQ pulse to the first end of the LJJ, after the applying of the negative SFQ pulse to the second end, while also removing the flux quantum from the inductive loop resulting in the second value of control flux being applied to the quantum-coherent superconducting circuit.

18. The system of claim 1,
wherein the LJJ comprises a parallel array of un-shunted Josephson junctions connected in parallel with capacitors; and
wherein the un-shunted Josephson junctions are interconnected by a series of inductors.

* * * * *